(12) United States Patent
Chiu

(10) Patent No.: US 7,253,700 B1
(45) Date of Patent: Aug. 7, 2007

(54) CIRCUIT FOR CONTROLLING A LINEAR-IN-DECIBELS ATTENUATOR CIRCUIT USING AN ANALOG CONTROL SIGNAL

(75) Inventor: Hon K. Chiu, Hayward, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 112 days.

(21) Appl. No.: 11/230,813

(22) Filed: Sep. 19, 2005

Related U.S. Application Data

(63) Continuation-in-part of application No. 11/160,210, filed on Jun. 14, 2005.

(51) Int. Cl.
*H03G 3/20* (2006.01)
(52) U.S. Cl. ............... 333/81 R; 330/254; 327/308
(58) Field of Classification Search .......... 333/81 R; 330/254, 256; 327/308
See application file for complete search history.

(56) References Cited

U.S. PATENT DOCUMENTS 5,408,199 A * 4/1995 Nagano et al. ............ 330/284

* cited by examiner

*Primary Examiner*—Stephen E. Jones

(57) ABSTRACT

A circuit for a digitally operating linear-in-decibels attenuator circuit controlled using an analog control signal. The attenuator circuit includes a resistor ladder, digitally controlled switches, and a flash analog-to-digital converter. The resistive ladder includes resistances coupled in series between an input and output electrode. The resistive ladder also includes shunt resistances, each of which is coupled to a corresponding series resistance and to a corresponding digitally controlled switch that is controlled by a corresponding digital control signal. Each of the switches include a pole electrode coupled to a corresponding shunt resistance and to the input electrode, and a throw electrode coupled to the corresponding shunt resistance and to the common node for attenuating voltage from an input signal. The flash analog-to-digital converter is controlled by an analog control signal and outputs digital control signals in a thermometer code for controlling the digitally controlled switches.

20 Claims, 11 Drawing Sheets

| Comparator | | 601 | 602 | 603 | 604 | 605 | 606 | 607 | 608 | 609 | 610 |
|---|---|---|---|---|---|---|---|---|---|---|---|
| Reference voltage | | 0.3 | 0.6 | 0.9 | 1.2 | 1.5 | 1.8 | 2.1 | 2.4 | 2.7 | 3 |
| Control Voltage, Vc | Vc > 3 | in0 | in0 | in0 | in0 | in0 | in0 | in0 | in0 | in0 | in0 |
| | 3 ≥ Vc > 2.7 | in0 | in0 | in0 | in0 | in0 | in0 | in0 | in0 | in0 | in1 |
| | 2.7 ≥ Vc > 2.4 | in0 | in0 | in0 | in0 | in0 | in0 | in0 | in0 | in1 | in1 |
| | 2.4 ≥ Vc > 2.1 | in0 | in0 | in0 | in0 | in0 | in0 | in0 | in1 | in1 | in1 |
| | 2.1 ≥ Vc > 1.8 | in0 | in0 | in0 | in0 | in0 | in0 | in1 | in1 | in1 | in1 |
| | 1.8 ≥ Vc > 1.5 | in0 | in0 | in0 | in0 | in0 | in1 | in1 | in1 | in1 | in1 |
| | 1.5 ≥ Vc > 1.2 | in0 | in0 | in0 | in0 | in1 | in1 | in1 | in1 | in1 | in1 |
| | 1.2 ≥ Vc > 0.9 | in0 | in0 | in0 | in1 | in1 | in1 | in1 | in1 | in1 | in1 |
| | 0.9 ≥ Vc > 0.6 | in0 | in0 | in1 | in1 | in1 | in1 | in1 | in1 | in1 | in1 |
| | 0.6 ≥ Vc > 0.3 | in0 | in1 | in1 | in1 | in1 | in1 | in1 | in1 | in1 | in1 |
| | 0.3 ≥ Vc | in1 | in1 | in1 | in1 | in1 | in1 | in1 | in1 | in1 | in1 |

CIRCUIT FOR CONTROLLING A LINEAR-IN-DECIBELS ATTENUATOR CIRCUIT USING AN ANALOG CONTROL SIGNAL

CROSS REFERENCE TO RELATED APPLICATIONS

This application is a continuation-in-part to the co-pending patent application, Ser. No. 11/160,210, entitled "Integrated Digitally Controlled Linear-In-Decibels Attenuator," with filing date Jun. 14, 2005, and assigned to the assignee of the present invention, the disclosure of which is hereby incorporated herein by reference.

BACKGROUND OF THE INVENTION

1. Field of the Invention

Embodiments of the present invention relate to the field of signal attenuation circuits. More particularly, embodiments of the present invention relate generally to a digitally controlled signal attenuation circuit controlled by an analog controlled flash analog-to-digital converter.

2. Related Art

Digitally controlled attenuator circuits are well-known in the art. Such attenuator circuits are generally used in controlled impedance environments, and allow the attenuation to be controlled in units or fractions of decibels (dBs). One particular type of such attenuator is referred to as a linear-in-dB attenuator, in which a thermometer code type of switching, or control, signal causes the attenuation to vary in single dB steps.

Referring to Prior Art FIG. 1, a conventional digitally controlled linear-in-dB attenuator includes a resistive ladder circuit with series resistances Rs2-Rs7 and shunt resistances Rp1-Rp7, interconnected substantially as shown, to which the input voltage signal Vin is applied. The voltages at nodes N1-N7 are applied to the throw electrodes of the single-pole, single-throw switch circuits S1-S7. The pole electrodes of these switches S1-S7 are mutually connected to provide the output signal Vout.

The switches S1-S7 are controlled with a digital control signal to selectively close one of the switches, depending upon the desired attenuation. For example, the series resistances Rs2-Rs7 would have nominal resistance values of 109 ohms, while the shunt resistances Rp1-Rp7 would have nominal resistances of 8170 ohms.

Referring to FIG. 1A, a problem with such conventional attenuator circuits is the limited bandwidth caused by the circuit topology. As seen in FIG. 1A, at or near a certain frequency Fc, the attenuation is no longer constant and begins to increase. This is due to the switch circuits S1-S7, which are typically implemented using metal oxide semiconductor field effect transistor (MOSFET) switches with low turn-on resistances. As is well-known in the art, such devices typically have relatively high parasitic capacitances at their drain and source electrodes. It is this parasitic capacitance that causes the bandwidth to be limited, thereby causing the attenuation characteristics to no longer be constant above a certain frequency Fc.

Further, also as shown in FIG. 1A, the bandwidth decreases as the attenuation increases. This is caused by the increased capacitance due to more of the switches S1-S7 being in their off states.

SUMMARY OF THE INVENTION

Accordingly, various embodiments of the present invention disclose a circuit for a digitally operating linear-in-decibels attenuator circuit that is controlled using an analog control signal. Embodiments of the present invention are capable of controlling the linear-in-decibels attenuator circuit with a thermometer code instead of binary code to set the desired attenuation. Furthermore, embodiments of the present invention provide an interface between the analog to digital converter and the linear-in-decibels digitally controlled attenuator without any combination logic, since the thermometer code is used for controlling the attenuator. Also, embodiments of the present invention provide for a wider bandwidth of attenuation over a greater range of frequencies.

Specifically, in one embodiment, a digitally operating linear-in-decibels attenuator circuit that is controlled by an analog signal is described. The attenuator circuit includes a resistor ladder, digitally controlled switches, and a flash analog-to-digital converter (ADC). The resistive ladder includes resistances coupled in series between an input and output electrode. The input electrode conveys an input signal. The output electrode conveys an output signal. The output signal is of a magnitude that is less than the magnitude of the input signal according to the attenuation applied. The resistive ladder also includes shunt resistances, each of which is coupled to a corresponding series resistance and to a corresponding digitally controlled switch.

Additionally, each of the digitally controlled switches is controlled by a corresponding digital control signal. Each of the switches include a pole electrode coupled to a corresponding shunt resistance and to the input electrode, and a throw electrode coupled to the corresponding shunt resistance and to the common node for attenuating voltage from an input signal at the input electrode.

Also, the flash analog-to-digital converter is controlled by an analog control signal and outputs digital control signals in a thermometer code for controlling the digitally controlled switches. Each of the switches is coupled to a corresponding digitally controlled switch.

BRIEF DESCRIPTION OF THE DRAWINGS

PRIOR ART

PRIOR ART

FIG. 7 is a table illustrating the control of the digitally controlled switches in the linear-in-decibels attenuator circuit of FIG. 6, in accordance with one embodiment of the present invention.

DETAILED DESCRIPTION OF THE INVENTION

Reference will now be made in detail to the preferred embodiments of the present invention, a circuit for a digitally controlled linear-in-decibels attenuator circuit that is controlled using an analog control signal from a flash ADC, examples of which are illustrated in the accompanying drawings.

Accordingly, various embodiments of the present invention disclose a circuit that includes a digitally controlled linear-in-decibels attenuator circuit and an analog controlled flash ADC that outputs a thermometer code of digital control signals for controlling the attenuator circuit. Embodiments of the present invention provide an interface between the analog to digital converter and the linear-in-decibels digitally controlled attenuator without any combination logic, since the thermometer code is used for controlling the attenuator. Also, embodiments of the present invention provide for a wider bandwidth of attenuation over a greater range of frequencies.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alphanumeric or alphanumeric designators. Further, while the present invention has been discussed in the context of implementations using discrete electronic circuitry, the functions of any part of such circuitry may alternatively be implemented using one or more appropriately programmed processors, depending upon the signal frequencies or data rates to be processed.

Figure 1:
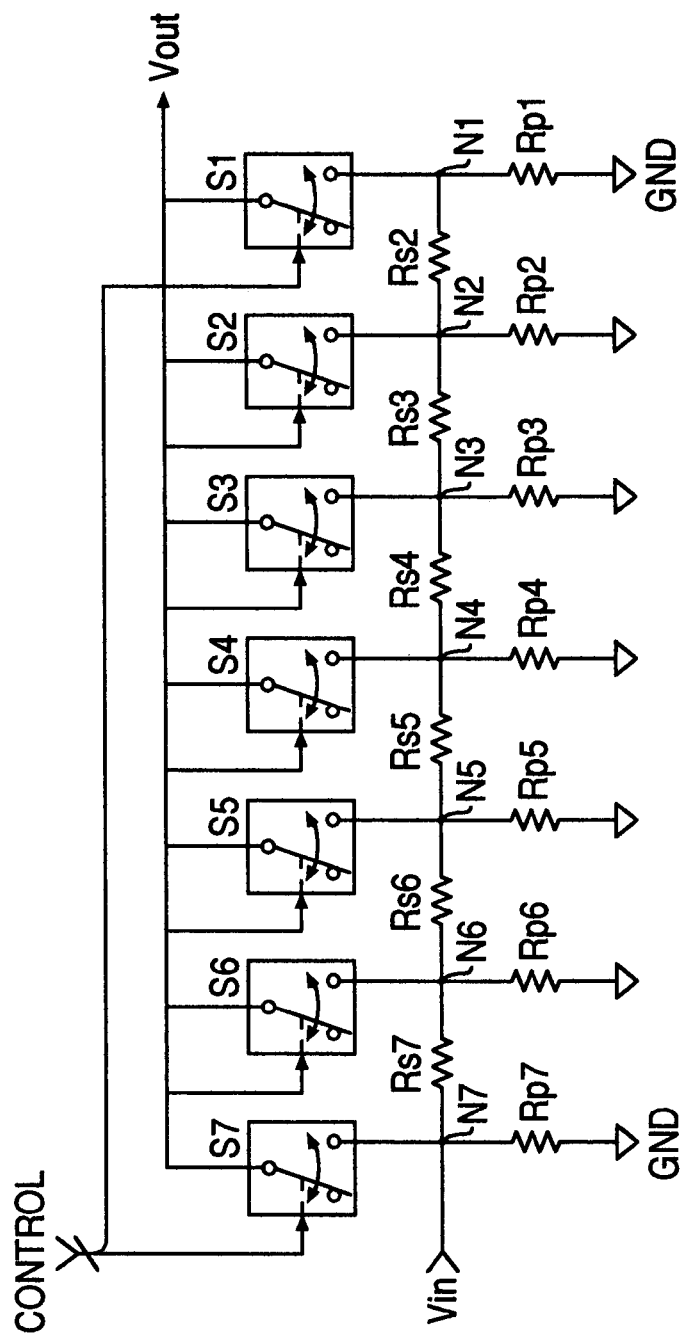
FIG. 1 is a schematic diagram of a conventional digitally controlled linear-in-dB attenuator circuit.
Figure 1A:
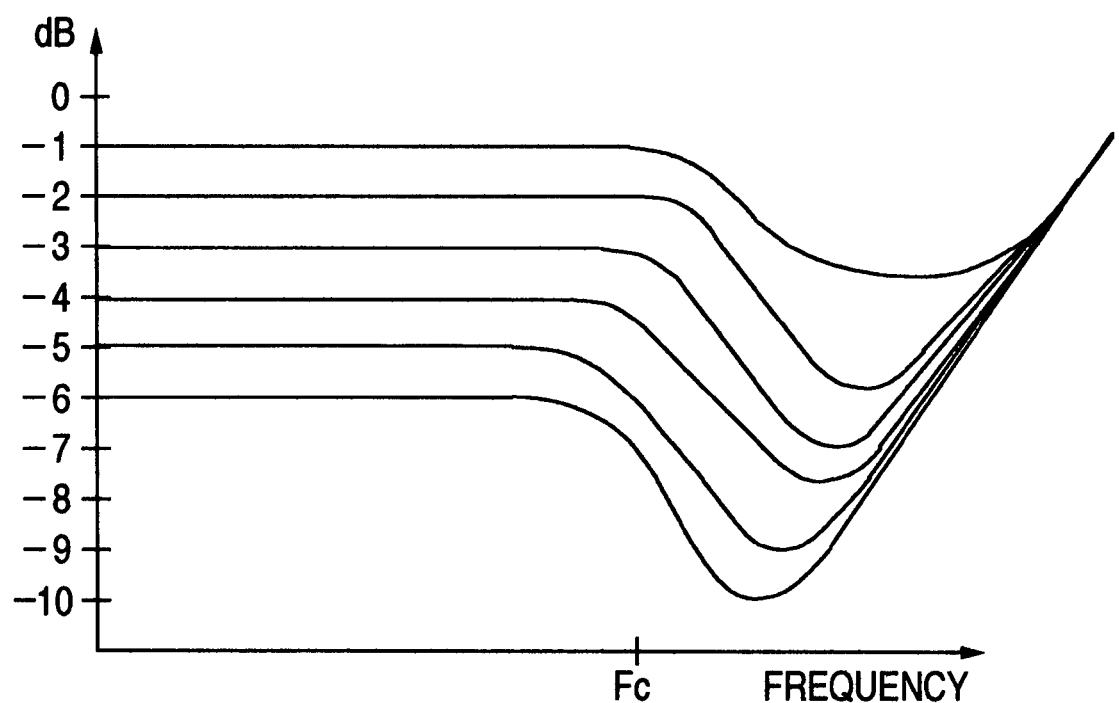
FIG. 1A is a graph of attenuation versus frequency for the circuit of FIG. 1.
Figure 2:
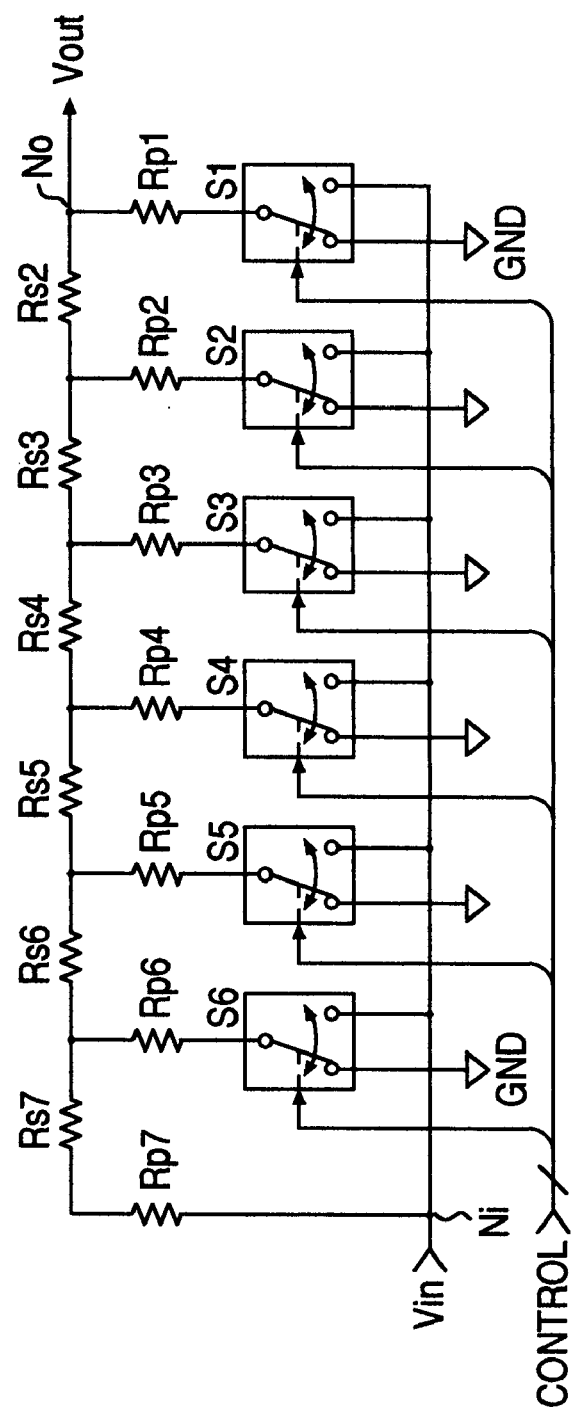
FIG. 2 is a schematic diagram of a digitally controlled linear-in-dB attenuator circuit, in accordance with one embodiment of the presently claimed invention.

Referring to FIG. 2, an integrated digitally controlled linear-in-dB attenuator circuit in accordance with one embodiment of the presently claimed invention includes a resistive ladder circuit, with series resistances Rs2-Rs7 and shunt resistances Rp1-Rp7, and single-pole, double-throw switch circuits S1-S6, all interconnected substantially as shown. It is understood by one of ordinary skill in the art that fewer or more series and shunt resistances and switch circuits can be used in accordance with the number of dB steps of attenuation desired, in accordance with embodiments of the present invention.

The input signal Vin is applied to the series resistances Rs2-Rs7 via resistance Rp7, and to resistances Rp1-Rp6 via the switch circuits S1-S6. Accordingly, the output signal Vout is provided at the output of the resistive ladder circuit (e.g., as opposed to the mutually connected pole electrodes of the switch circuits S1-S6). This circuit topology advantageously increases the output impedance at the output node No since the pole electrodes of the switch circuits S1-S6 are isolated from the output node No by the shunt Rp1-Rp6 and series Rs2-Rs6 resistances, and the throw electrodes are connected either to the low impedance input node Ni or to circuit ground GND, depending upon the desired signal attenuation.

Figure 2A:
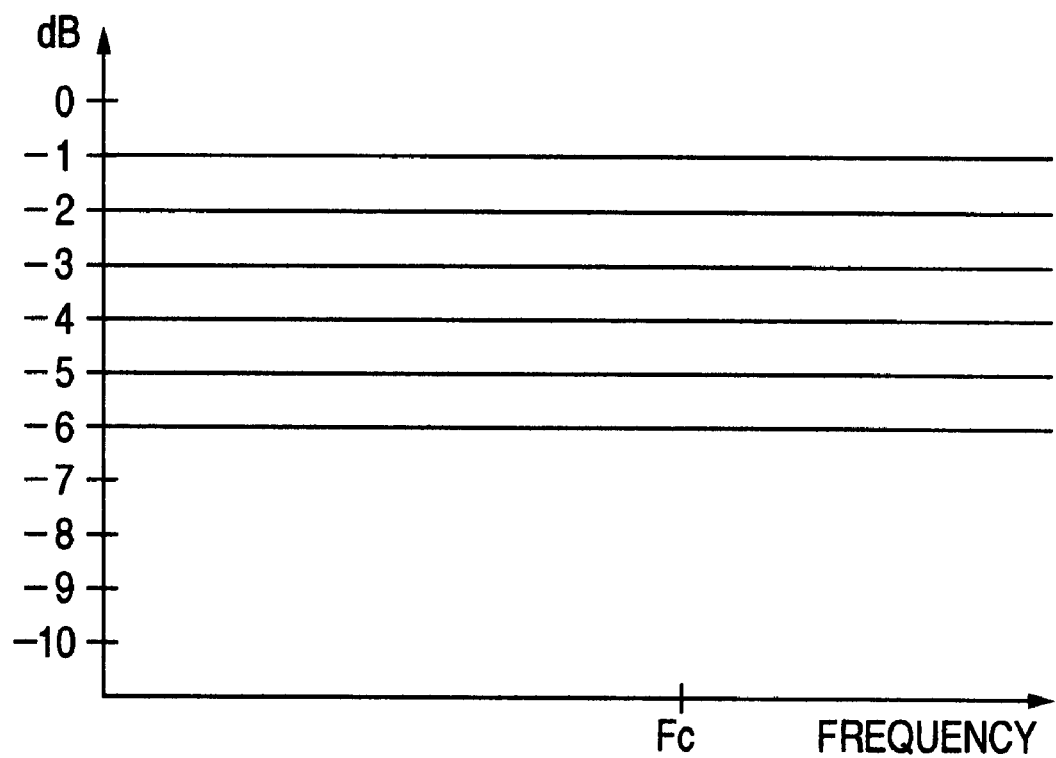
FIG. 2A is a graph of attenuation versus frequency for the circuit of FIG. 2, in accordance with one embodiment of the present invention.

Referring to FIG. 2A, as a result of this circuit topology, the signal attenuation remains more constant over a wider frequency bandwidth due to the isolation of the parasitic capacitances of the switch circuits S1-S6 from the output node No, in accordance with one embodiment of the present invention.

Figure 3:
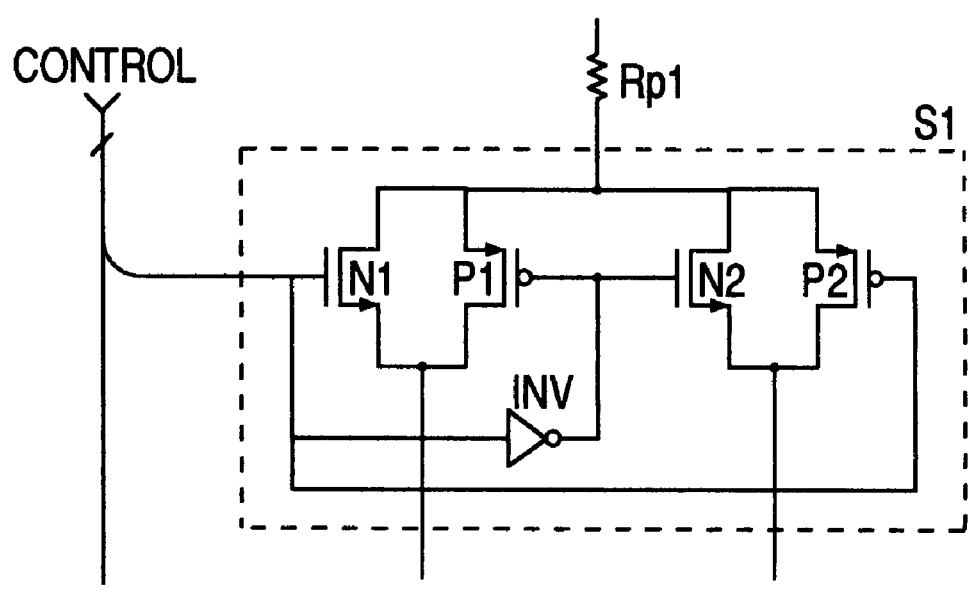
FIG. 3 is a schematic diagram of one example of an implementation of a switch circuit for the attenuator circuit of FIG. 2, in accordance with one embodiment of the present invention.

Referring to FIG. 3, an example embodiment of a switch circuit, e.g., the first switch circuit S1, includes pairs of N-type and P-type MOSFET5 interconnected as transmission gates, in accordance with one embodiment of the present invention. For example, complementary pairs N1, P1 and N2, P2 of MOS transistors are interconnected with mutually coupled drain and source electrodes as shown. The incoming control signal drives the gate electrodes of transistors N1 and P2, while the inverted control signal (inverted by an inverter circuit INV) drives the gate electrodes of transistors P1 and N2. Hence, when the control signal is asserted high, the N1-P1 transistor pair is turned on while the N2-P2 transistor pair is turned off. Conversely, when the control signal is de-asserted low, transistor pair N2-P2 is turned on while transistor pair N1-P1 is turned off.

Alternatively, instead of transmission gates, single transistors can be used as pass transistors, in accordance with another embodiment of the present invention. For example, transistors N1 and P2 can be used with transistors P1 and N2 omitted.

Figure 4:
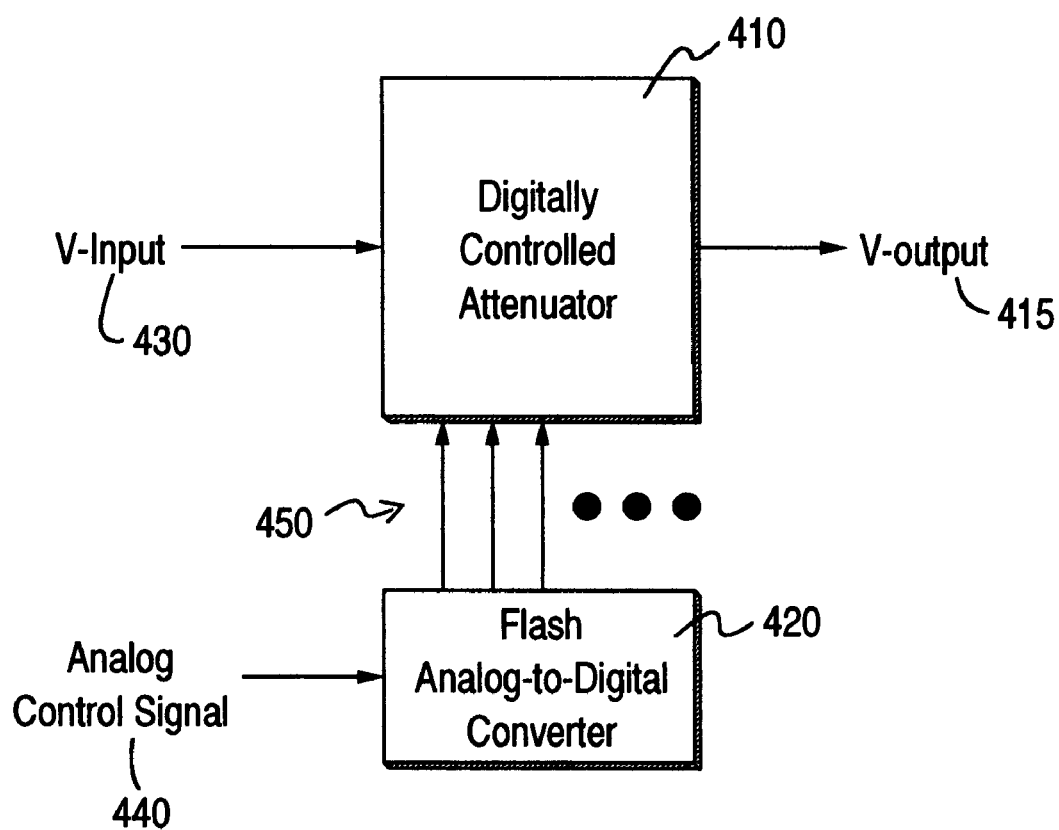
FIG. 4 is a block diagram of a digitally controlled linear-in-decibels attenuator that is controlled using an analog control signal generated from a flash ADC, in accordance with one embodiment of the present invention.

FIG. 4 is a block diagram of a system 400 that is capable of attenuating an input signal using an analog control signal, in accordance with one embodiment of the present invention. The system includes a digitally controlled linear-in-decibels attenuator circuit 410. The attenuator circuit 410 is controlled with a plurality of digital control signals 450. The attenuator circuit 410 acts to attenuate the input signal 430. That is, the attenuator circuit 410 generates an output signal 415 that has a magnitude that is less than or equal to the input signal 430 depending on the degree of attenuation applied by the digitally controlled attenuator circuit 410.

The degree of attenuation applied is determined by the analog control signal 440. Specifically, the analog control signal controls the flash ADC 420. The flash ADC 420 outputs a thermometer code through the plurality of digital control signals 450 for controlling the digitally controlled attenuator. Depending on the value of the analog control signal, the flash ADC outputs a corresponding value in the thermometer code for controlling the digitally controlled attenuator 410. In one embodiment, as the value of the analog control signal decreases, more attenuation is applied, as dictated by the state of the plurality of digital control signals in the thermometer code, by the digitally controlled attenuator 410 to the input signal 430.

Figure 5:
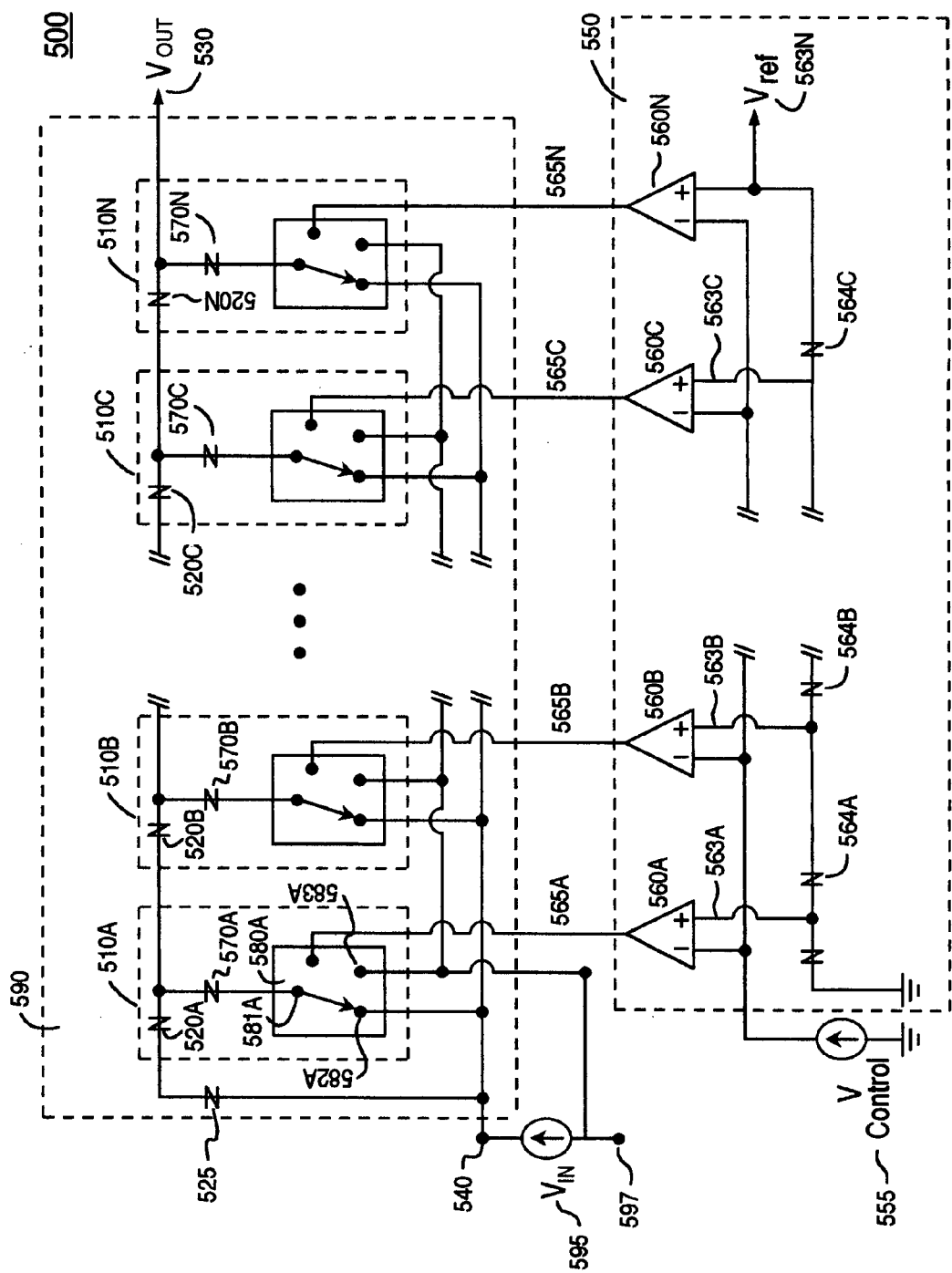
FIG. 5 is a schematic diagram of a digitally controlled linear-in-decibels attenuator that is controlled using an analog control signal generated from a flash ADC, in accordance with one embodiment of the present invention.

FIG. 5 is a schematic diagram of a circuit 500 that controls a digitally controlled linear-in-decibels digital attenuator circuit 590 using an analog control signal 555, in accordance with one embodiment of the present invention. The flash ADC 550 interface with the linear-in-decibels attenuator circuit 590 is created without using any combination logic since the flash ADC produces thermometer code for controlling the linear-in-decibels attenuator circuit 590.

The circuit 500 includes the linear-in-decibels attenuator circuit 590. The attenuator circuit 590 includes a first resistance 525 that is coupled to an input electrode 540. The input electrode 540 conveys an input signal 595.

The linear-in-decibels attenuator circuit 590 also includes a plurality of attenuator blocks 510 (e.g., including 510A, 510B, 510C . . . 510N) that is coupled to the first resistance 525. Each of the plurality of attenuator blocks 510 attenuates the input signal 595 depending on a corresponding digital control signal it receives from the flash ADC 550.

A description of the attenuator block 510A is presented. Each of the plurality of attenuator blocks 510 is similarly configured. For example, description of the attenuator block 510A is representative of each of the attenuator blocks (e.g., 510B, 510C . . . 510N). The attenuator block 510A includes a series resistor 520A that is coupled at a first end with the resistance 525 and at the other end to the output electrode 530. In addition, the series resistances (e.g., 520A, 520B, 520C . . . 520N) along with the resistance 525 are coupled together in series between the input electrode 540 and the output electrode 530. The output electrode 530 conveys an output signal.

The attenuator block 510A also includes a shunt resistance 570A. The shunt resistance is coupled to a node that couples the resistance 520 to the output electrode 530.

The attenuator block 510A also includes a digitally controlled switch 580A. The switch 580A is controlled by a corresponding digital control signal 565A from the flash ADC 550. The switch 580A provides for attenuation of the input signal depending on the digital control signal 565A.

For instance, in one embodiment, when the digital control signal 565A is low, the switch 580A connects the shunt resistance 570A to the input electrode 540 through the pole electrode 582A. In this position, substantially no attenuation is applied to the input signal 595 from the attenuator block 510A. Similarly, when all of the attenuator blocks in the plurality of attenuator blocks 510 are coupled to the input electrode 540, substantially no attenuation is applied to the input signal 595 since the shunt resistances (570A, 570B, 570C . . . 570N) are coupled effectively in a parallel configuration.

Conversely, when the digital control signal 565A is high, the switch 580A connects the shunt resistance 570a to the common node 597 through a throw electrode 583A. In this case, the attenuator block provides attenuation of the input signal 595, since a current path is provided through the attenuator block to a circuit ground at the node 597. In one embodiment, the node 597 represents ground. In another embodiment, the node 597 represents an alternating current (AC) ground.

In one embodiment, each of the plurality of attenuator blocks 510 provides a one dB attenuation of the input signal 595. For instance, any of the plurality of attenuator blocks 510 can provide one dB attenuation. To provide two dBs of attenuation, any two of the attenuator blocks in the plurality of attenuator blocks 510 can be selected for shunting current. Increasing attenuation requires selection of additional attenuator blocks. Other embodiments are capable of providing other increments of attenuation of the input signal 595.

The flash ADC 550 provides the plurality of digitally controlled signals 565 (e.g., 565A, 565B, 565C . . . 565N), in accordance with one embodiment. The flash ADC 550 includes a plurality of comparators 560 (e.g., 560A, 560B, 560C . . . 560N). Each of the comparators compares an analog control signal 555 to a respective reference voltage (e.g., 563A, 563B, 563C . . . 563N).

For instance, the comparator 560A generates the digital control signal 565 by comparing the control signal 555 to the reference voltage 563A. The comparator 560A generates the digital control signal 565A that controls the switch 580A in the attenuator block 510a. Functionally, the comparator 560A generates a digital control signal 565A that goes high when the analog control signal is less than the corresponding reference voltage 563A, which in turn produces attenuation through attenuator block 510A. Conversely, when the analog control signal 555 is higher than the reference voltage 563A, the digital control signal 565A is low, which in turn produces no attenuation.

In one embodiment, the flash ADC 550 generates thermometer code for controlling the digitally controlled switches in the plurality of attenuator blocks 510 of the linear-in-dB attenuator circuit 590. That is, as the control voltage 555 is decreased, the thermometer code instructs the linear-in-decibels attenuator circuit to further attenuate the input signal 595. Specifically, as the control voltage 555 is decreased, the plurality of digital control signals 565 (e.g., 565A, 565B, 565C . . . 565N) progressively changes in the thermometer code to apply more attenuation through the plurality of attenuator blocks 510.

As shown in FIG. 5, the attenuation is first applied from the attenuator block 510N closest to the output electrode 530. Subsequent increments of attenuation are applied through the next closest attenuator blocks closest to the output electrode. In one embodiment, the attenuator blocks apply one dB in attenuation.

Inspection of the drop in reference voltages 563 in the flash ADC illustrates how the attenuation is applied in the system 500. As shown in FIG. 5, the reference voltage 563N is higher than the reference voltage 563C because of the voltage drop over resistance 564C. Similarly, the reference voltage 563C is higher than the reference voltage 563B because of the voltage drop over resistance 564B. Similarly, the reference voltage 563B is higher than the reference voltage 563A because of the voltage drop over resistance 564A. As such, as the analog control signal 555 progressively decreases, successive comparators will send a digital control signal that is high, indicating that the corresponding attenuator block should attenuate the input signal 595. For instance, as the analog control signal 555 progressively decreases, the digital control signals from the comparators will go high in the following order: 565N, 565C, 565B . . . 565A.

Figure 6:
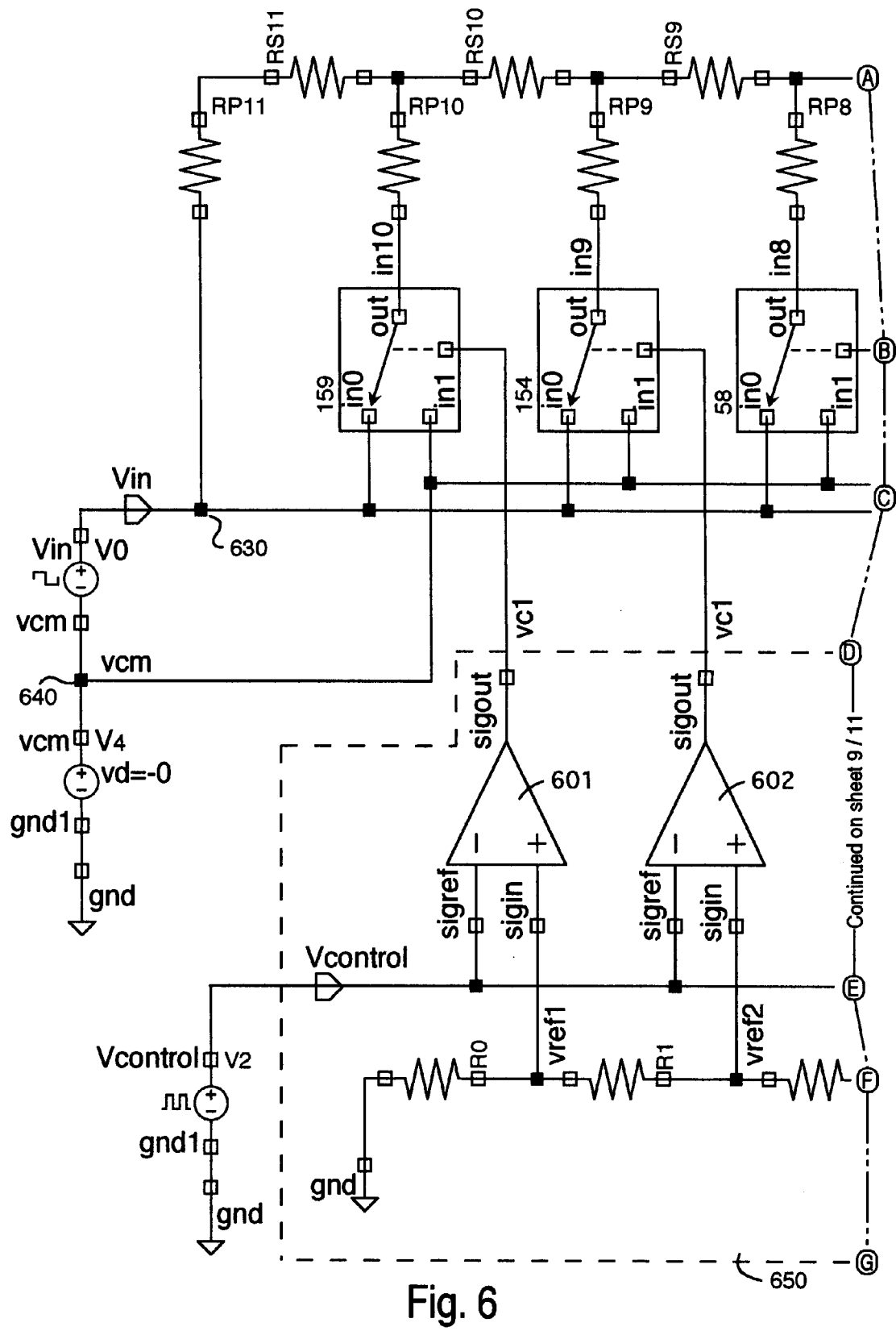
FIG. 6 is a schematic diagram of one example of an implementation of the linear-in-decibels attenuator circuit and flash ADC of FIG. 5, in accordance with one embodiment of the present invention.
Figure 6:
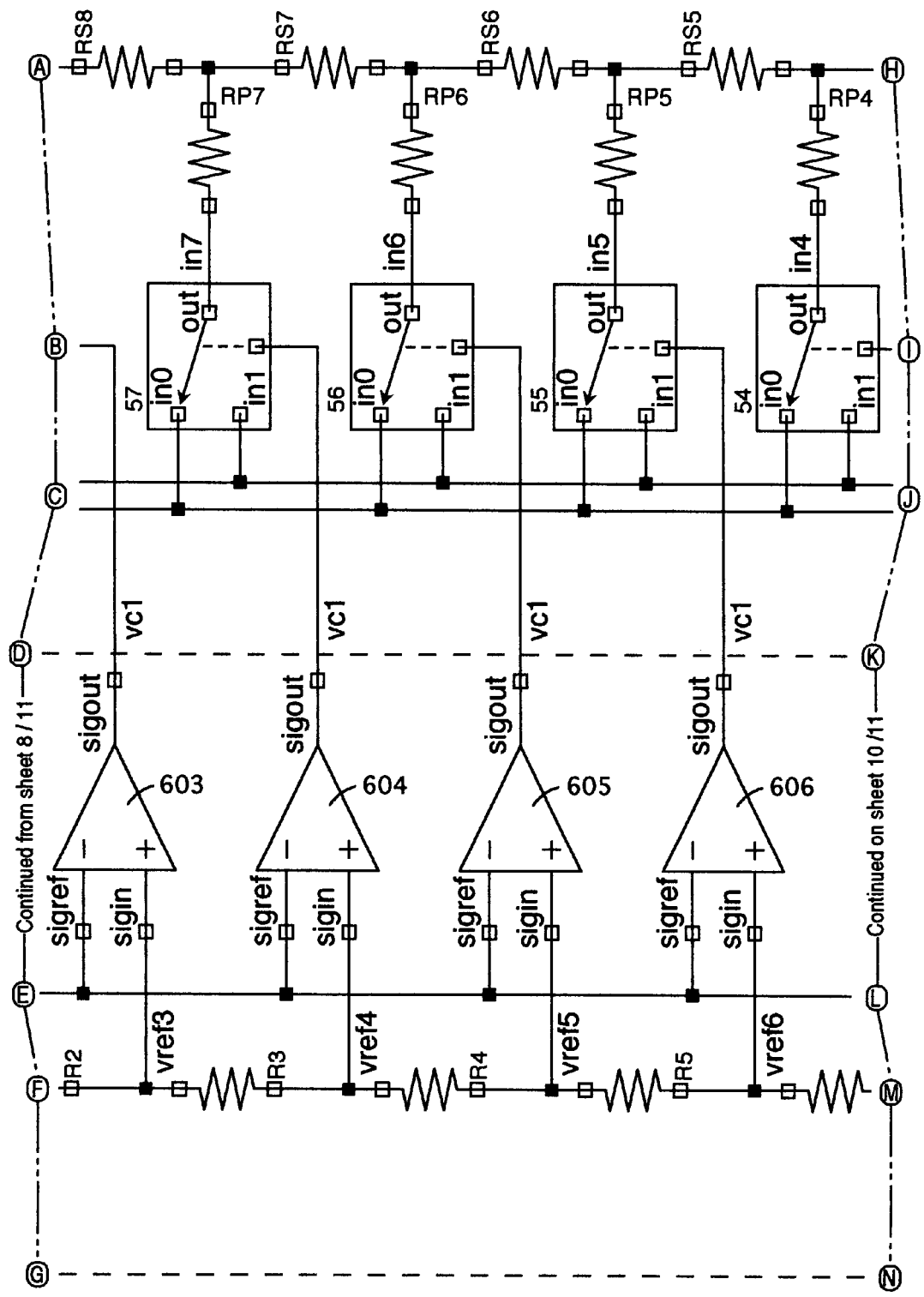
Figure 6:
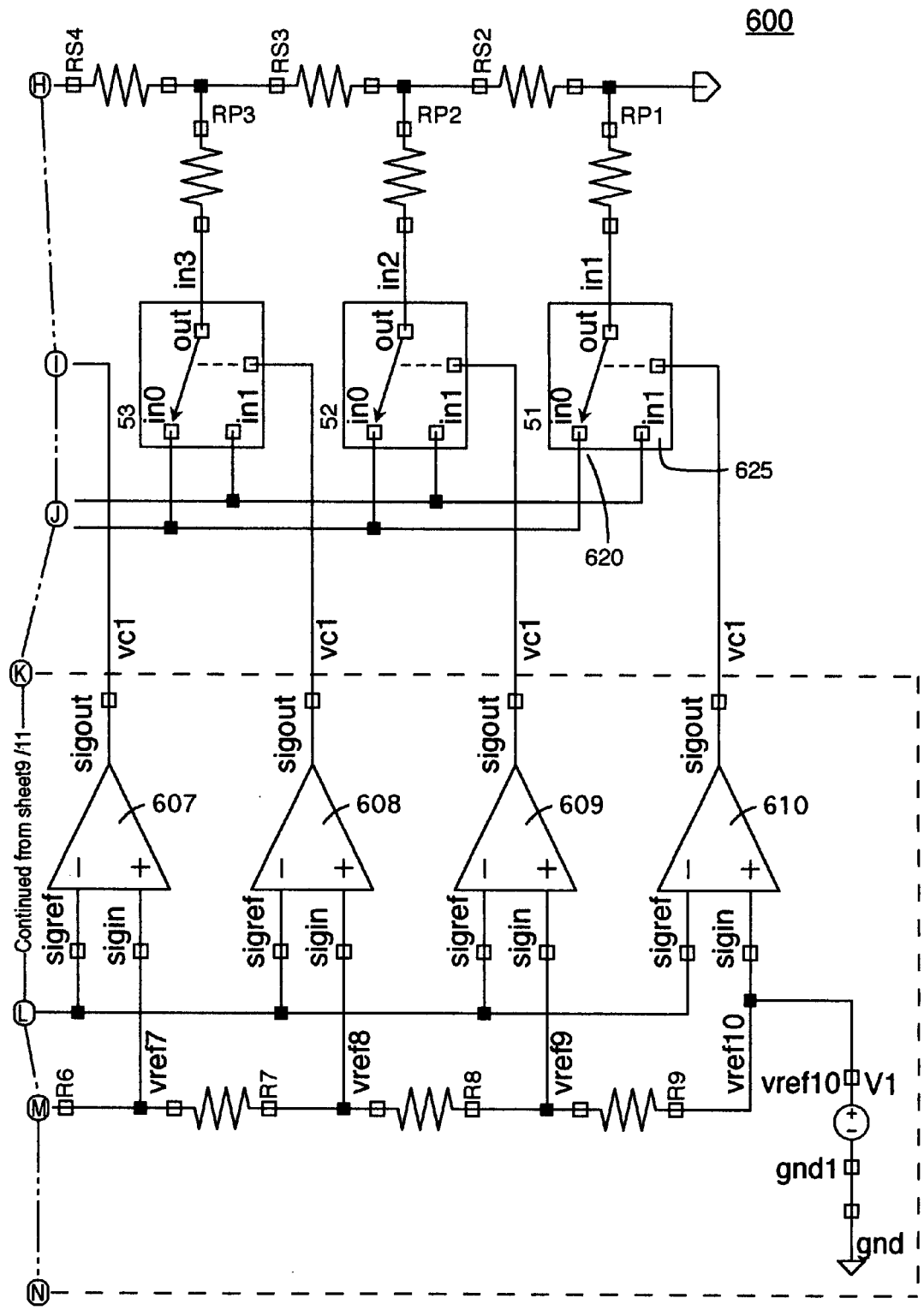

FIG. 6 is a schematic diagram of one example of an implementation of the linear-in-decibels attenuator circuit and flash ADC of FIG. 5, in accordance with one embodiment of the present invention. FIG. 6 describes a system 600 that includes a digitally operating linear-in-decibels attenuator circuit that is controlled using an analog control signal through a flash ADC, in accordance with embodiments of the present invention.

The system 600 includes a resistive ladder circuit that includes a plurality of series resistances and a plurality of shunt resistances. The plurality of series resistances (RS2-11 and RP11) are coupled in series between an input electrode 630 for conveying an input signal Vin and an output electrode for conveying an output signal Vout.

The plurality of shunt resistances (RP1-10) are each coupled to a corresponding series resistance and to a corresponding digitally controlled switch. For instance, the shunt resistance RP1 is coupled to the series resistance RS2 and to the switch S1.

The system also includes a plurality of digitally controlled switches (S1-S8, 154, and 159). Each of the digitally controlled switches is controlled by a corresponding digital control signal. For instance, the switch S1 is controlled by the digital control signal vc10 from the comparator 610.

Each of the digitally controlled switches includes a pole electrode and a throw electrode. For instance, in switch S1, the pole electrode 620 is coupled to the shunt resistance RP1 and to the input electrode 630. Selection of the pole electrode provides no attenuation of the input signal Vin as influenced by the switch S1.

Each of the digitally controlled switches also includes a throw electrode that is coupled to the corresponding shunt resistance and to a common node 640. Implementation of the throw electrode attenuates voltage of the input signal by creating a current path through the shunt resistance to the circuit ground at the common node 640.

The flash ADC 650 provides the plurality of digitally controlled signals (e.g., vc1-vc10) to control the plurality of digitally controlled switches. The flash ADC is controlled by an analog control signal (Vcontrol) and produces the plurality of digitally controlled signals. Each of the digitally controlled signals controls a corresponding digitally controlled switch.

The flash ADC 650 includes a plurality of comparators (e.g., 601-610). Each of the comparators compare the analog control signal Vcontrol to a respective reference voltage (e.g., vref1-vref10) to generate a respective digital control signal (vc1-vc10). For instance, the comparator 610 generates the vc10 by comparing the control signal Vcontrol to the vref10. The comparator 610 generates the vc10 that controls the switch, S1. Functionally, the comparator 610 generates vc10 that goes high when the Vcontrol is less than the corresponding reference voltage, vref10, which in turn produces attenuation of the input signal, Vin. Conversely, when the Vcontrol is higher than vref10, vc10 is low, which in turn produces no attenuation.

In one embodiment, the flash ADC 650 generates thermometer code for controlling the digitally controlled switches of the linear-in-dB attenuator circuit. That is, as the control voltage Vcontrol is decreased, the thermometer code instructs the linear-in-decibels attenuator circuit to further attenuate the input signal Vin. Specifically, as the analog control voltage, Vcontrol, is decreased, the plurality of digital control signals vc1-vc10 progressively changes in the thermometer code to apply more attenuation to the input signal Vin.

FIG. 7 is a table 700 that illustrates the control of the digitally controlled switches in the linear-in-decibels attenuator circuit of FIG. 6, in accordance with one embodiment of the present invention. FIG. 7 and the values contained therein are shown for purposes of illustration only. Table 700 illustrates the selection of the pole (e.g., low, in0, at 620) or throw electrode (e.g., high, in1, at 625) for each of the switches (S1-S8, 154 and 159). The columns represent the pole or throw selection for each of the switches associated with the comparators in the flash ADC 650. In addition, an exemplary reference voltage for each of the comparators is shown. For instance, for illustrative purposes only, vref for comparator 608 is 2.4 volts.

Each of the rows correspond to a value for the analog control signal as applied to the flash ADC. As shown in FIG. 7, the analog control voltage, Vcontrol, is decreasing in value going down chart 700.

As shown in FIG. 6 and table 700, the attenuation of the input signal, Vin, is first applied from the switch, S1, closest to the output electrode that conveys the output signal, Vout. Subsequent increments of attenuation are applied through the next closest switches closest to the output electrode. In one embodiment, the resistive ladder circuit and the plurality of digitally controlled switches are configured to attenuate the input signal in one db increments.

As shown in FIGS. 6 and 7, the drop in reference voltages in the flash ADC illustrates how the attenuation is applied in the system 600. As shown in FIG. 6, the reference voltage, vref10, is higher than vref9 because of the voltage drop over resistance, R9. Similarly, vref9 is higher than vref8 because of the voltage drop over R8. The drop in reference voltages used by each of the comparators in the flash ADC 650 is reproduced from vref10 down to vref1, as is shown in FIG. 7.

As such, as the Vcontrol progressively decreases, successive comparators will send a digital control signal that is high, indicating that the corresponding switch should attenuate the input signal, Vin. For instance, as the Vcontrol progressively decreases, the digital control signals from the comparators will go high in the following order: 610, 609, 608, 607, 606, 605, 604, 603, 602, and 601.

Similarly, in table 700, as Vcontrol goes below each of the reference voltages, the corresponding switch will select the throw pole for attenuating the input signal. For instance, when Vcontrol is at 2.9 volts, the digital control signal from the comparator 10 goes high, but the digital control signals from comparators 1-9 remain low. Similarly, when Vcontrol is at 2.6 volts, the digital control signals from comparators 10 and 9 go high, but the digital control signals from comparators 1-8 remain low. As such, as Vcontrol decreases, subsequent comparators will go high, further applying increased attenuation of the input signal, Vin.

Accordingly, various embodiments of the present invention disclose a circuit that includes a digitally controlled linear-in-decibels attenuator circuit and an analog controlled flash ADC that outputs a thermometer code of digital control signals for controlling the attenuator circuit. Embodiments of the present invention provide an interface between the analog to digital converter and the linear-in-decibels digitally controlled attenuator without any combination logic, since the thermometer code is used for controlling the attenuator. Also, embodiments of the present invention provide for a wider bandwidth of attenuation over a greater range of frequencies.

Embodiments of the present invention, a circuit including a digitally controlled linear-in-decibels attenuator circuit controlled by an analog control signal through a flash ADC are described. While the invention is described in conjunction with the preferred embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

What is claimed is:

1. An analog controlled linear-in-decibels digital attenuator circuit, comprising:

a first resistance coupled to an input electrode conveying an input signal;

a plurality of attenuator circuits coupled to said first resistance, wherein each of said plurality of attenuator circuits comprises:

a series resistance coupled at a first end with said first resistance to said input electrode and at a second end to an output electrode for conveying an output signal;

a shunt resistance coupled to said second end of said series resistance; and a digitally controlled switch controlled by a corresponding digital control signal for controlling attenuation of said input signal; and a flash analog-to-digital converter controlled by an analog control signal for providing a plurality of digital control signals each of which is coupled to and for controlling a corresponding digitally controlled switch in one of said plurality of attenuator circuits.

2. The circuit of claim 1, wherein said flash analog-to-digital converter outputs thermometer code for controlling digitally controlled switches in said plurality of attenuator circuits.

3. The circuit of claim 1, wherein each of said plurality of attenuator circuits is configured to attenuate said input signal in approximately 1 dB increments.

4. The circuit of claim 1, wherein said output signal has a magnitude that is less than a magnitude of said input signal.

5. The circuit of claim 1, wherein said digitally controlled switch further comprises:
a pole electrode coupled to said shunt resistance and to said input electrode; and
a throw electrode coupled to said shunt resistance and to a common node for attenuating voltage from said input signal.

6. The circuit of claim 5, wherein said common node comprises ground.

7. The circuit of claim 5, wherein said common node comprises an alternating current circuit ground potential.

8. An analog controlled linear-in-decibels digital attenuator circuit, comprising:
a resistive ladder circuit comprising:
a plurality of series resistances coupled in series between an input electrode for conveying an input signal and an output electrode for conveying an output signal; and
a plurality of shunt resistances each of which is coupled to a corresponding series resistance of said plurality of series resistances and to a corresponding digitally controlled switch;
a plurality of digitally controlled switches each of which is controlled by a corresponding digital control signal, wherein each of said plurality of digitally controlled switches comprises:
a pole electrode coupled to a respective one of said plurality of shunt resistances and to said input electrode; and
a throw electrode coupled to a respective one of said plurality of shunt resistances and to a common node for attenuating voltage from said input signal; and
a flash analog-to-digital converter controlled by an analog control signal for providing a plurality of digital control signals each of which is coupled to and for controlling a corresponding digitally controlled switch.

9. The circuit of claim 8, wherein said common node is ground.

10. The circuit of claim 8, wherein said common node is an alternating current circuit ground potential.

11. The circuit of claim 8, wherein said output signal has a magnitude that is less than a magnitude of said input signal.

12. The circuit of claim 8, wherein said plurality of series resistances comprises a first resistance coupled to said input electrode;
a second resistance coupled in series with said input electrode through said plurality of series resistances, and coupled to a corresponding digitally controlled switch through a corresponding shunt resistance.

13. The circuit of claim 8, wherein said flash analog-to-digital converter outputs thermometer code for controlling said plurality of digitally controlled switches.

14. The circuit of claim 13, wherein said resistive ladder circuit and said plurality of digitally controlled switches are configured to attenuate said input signal in 1 db increments.

15. An apparatus including an integrated digitally controlled linear-in-decibels attenuator circuit, comprising:
a plurality of attenuation control electrodes to convey a plurality of digital control signals corresponding to a signal attenuation value;
an input signal electrode to convey an input signal;
an output signal electrode to convey an output signal corresponding to said input signal and having a magnitude which is less than an input signal magnitude of said input signal in relation to said signal attenuation value;
a resistive ladder circuit including a plurality of series resistances coupled in series between said input and output signal electrodes, and a plurality of shunt resistances each of which is coupled in shunt to a corresponding series resistance of said plurality of series resistances;
a plurality of switch circuits, each of which comprises:
a pole electrode coupled to a respective one of said plurality of shunt resistances and to said input electrode; and
a throw electrode coupled to a respective one of said plurality of shunt resistances and to said common node for attenuating voltage from said input signal; and
a flash analog-to-digital converter controlled by an analog control signal for providing said plurality of digital control signals each of which is coupled to and for controlling a corresponding digitally controlled switch.

16. The apparatus of claim 15, wherein at least one of said plurality of series resistances and at least one of said plurality of shunt resistances comprises a biased metal oxide semiconductor transistor.

17. The apparatus of claim 15, wherein at least one of said plurality of switch circuit comprises a pass transistor.

18. The apparatus of claim 15, wherein said common node is coupled to a circuit ground potential.

19. The apparatus of claim 15, wherein said flash analog-to-digital converter outputs thermometer code for controlling digitally controlled switches in said plurality of attenuator circuits.

20. The circuit of claim 15, wherein each of said plurality of shunt resistances is configured to attenuate said input signal in approximately 1 dB increments.

* * * * *